United States Patent
Kawabata et al.

(10) Patent No.: US 7,365,416 B2
(45) Date of Patent: Apr. 29, 2008

(54) MULTI-LEVEL SEMICONDUCTOR MODULE AND METHOD FOR FABRICATING THE SAME

(75) Inventors: Takeshi Kawabata, Osaka (JP); Motoaki Satou, Kyoto (JP); Toshiyuki Fukuda, Kyoto (JP); Toshio Tsuda, Osaka (JP); Kazuhiro Nobori, Osaka (JP); Seiichi Nakatani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 299 days.

(21) Appl. No.: 11/242,904

(22) Filed: Oct. 5, 2005

(65) Prior Publication Data

US 2006/0131740 A1 Jun. 22, 2006

(30) Foreign Application Priority Data

Dec. 16, 2004 (JP) ............................. 2004-364586

(51) Int. Cl.
*H01L 23/02* (2006.01)
(52) U.S. Cl. ..................................... 257/686; 257/777
(58) Field of Classification Search ................ 257/686, 257/777, 723, 724; 438/107, 109, 110
See application file for complete search history.

(56) References Cited

U.S. PATENT DOCUMENTS 6,313,522 B1 * 11/2001 Akram et al. ............... 257/686
6,472,735 B2 * 10/2002 Isaak .......................... 257/686
6,492,718 B2 * 12/2002 Ohmori ....................... 257/686
6,501,165 B1 * 12/2002 Farnworth et al. ........... 257/686
6,897,552 B2 *  5/2005 Nakao ......................... 257/686
2001/0054758 A1 * 12/2001 Isaak .......................... 257/686
2003/0111722 A1 *  6/2003 Nakao ......................... 257/686
2004/0238935 A1 * 12/2004 Yoshimura ................... 257/686
2005/0184377 A1 *  8/2005 Takeuchi et al. ............. 257/686
2006/0231939 A1 * 10/2006 Kawabata et al. ........... 257/686
2007/0057358 A1 *  3/2007 Satou et al. ................. 257/686

FOREIGN PATENT DOCUMENTS

JP       2002-064179 A     2/2002
JP       2003-218273 A     7/2003

* cited by examiner

*Primary Examiner*—S. V Clark
(74) *Attorney, Agent, or Firm*—McDermott Will & Emery LLP

(57) ABSTRACT

A semiconductor module is formed by alternately stacking resin boards 3 on which semiconductor chips 2 are mounted and sheet members having openings larger than the semiconductor chips 2 and bonded to the resin boards 3. The resin board 4 located at the bottom out of the resin boards 3 is thicker than the other resin boards 3.

13 Claims, 12 Drawing Sheets

MULTI-LEVEL SEMICONDUCTOR MODULE AND METHOD FOR FABRICATING THE SAME

CROSS-REFERENCE TO RELATED APPLICATION

This application claims priority under 35 U.S.C. §119(a) on Patent Application No. 2004-364586 filed in Japan on Dec. 16, 2004, the entire contents of which are hereby incorporated by reference.

BACKGROUND OF THE INVENTION

1. Field of the Invention

The present invention relates to three-dimensional multi-level semiconductor modules formed by alternately stacking sheet members and resin boards on which semiconductor chips are mounted and also relates to methods for fabricating the modules.

2. Description of the Related Art

With demands for size reduction and performance improvement of various electronic devices such as cellular phones and digital cameras, multi-level semiconductor modules formed by stacking and uniting a plurality of electronic components, especially semiconductor chips, have been proposed.

Methods for easily manufacturing such multi-level semiconductor modules at low cost have been proposed to date.

A conventional semiconductor module is formed by stacking, as one unit, a printed board on which a given circuit is formed, a semiconductor chip mounted on the printed board, and an interlayer member that has an opening capable of accommodating the semiconductor chip and includes a conductive bump capable of being connected to the circuit on the printed board. Such a conventional semiconductor module is fabricated by a method including the steps of: attaching protective films to both faces of an insulating base serving as an interlayer member; forming a through hole at a given position of the insulating base; filling the through hole with a conductive paste so as to form a conductive bump; peeling off the protective films; forming, in the insulating base, an opening capable of accommodating a semiconductor chip; and alternately stacking and bonding insulating bases and printed boards (see, for example, Japanese Unexamined Patent Publication No. 2002-64179).

With this method, a through hole is formed at a given position in an insulating base having both faces to which protective films are attached, the through hole is filled with a conductive paste, and then the protective films are peeled off, thereby forming conductive bumps protruding from the faces of the insulating base. Since the through hole penetrating the insulating base is filled with the conductive paste in this method, generation of a gap in a hole during the filling is avoided and connection reliability is enhanced, as compared to the case of using a via hole whose one open side is closed. In addition, electroplating that requires time and labor is unnecessary. Accordingly, a semiconductor module is easily fabricated at low cost.

Further, with miniaturization of electronic equipment such as IC cards and cellular phones, the density of semiconductor modules needs to be further increased and the thickness thereof needs to be further reduced. For this purpose, a semiconductor module having a stacked structure in which circuit boards on which semiconductor chips are mounted and interlayer members are alternately stacked and then are pressed with application of heat has been proposed (e.g., Japanese Unexamined Patent Publication No. 2003-218273). Specifically, circuit boards on which semiconductor chips have been mounted beforehand and interlayer members having openings capable of accommodating the semiconductor chips are alternately stacked with adhesive layers interposed therebetween, and then this stacked structure is pressed with application of heat. In this manner, the semiconductor chips are buried in the openings of the interlayer members so that electrical connection is established between the semiconductor chips through conductive posts formed on the interlayer members. With this method, the distance between the semiconductor chips is reduced, and failures caused by wiring resistance and inductance are reduced. As a result, electric signals are transmitted without delay and the density and function of the printed board are enhanced and the thickness thereof is reduced.

SUMMARY OF THE INVENTION

In recent years, techniques for reducing the thickness of semiconductor chips by polishing and techniques for mounting the thin semiconductor chips on boards with high yields have been developed, so that the number of levels of such stacked semiconductor chips has been further increasing. In addition, in a semiconductor memory, for example, as the memory capacity increases, the chip area increases. If a module is formed by stacking large semiconductor chips in multiple levels, the problem of a warp of the module arises. The degree of warp of the module increases as the thickness of a printed board decreases. Accordingly, to stack printed boards on which semiconductor chips are mounted and interlayer members in multiple levels, it is important to suppress the occurrence of a warp.

On the other hand, to reduce the size and thickness of electronic devices, semiconductor chips and semiconductor modules are often packaged by, for example, a ball grid array (BGA) method in recent years. With such a packaging method, solder balls and bump electrodes formed to establish connection to a mother board cannot be so high. Accordingly, if a warp occurs at room temperature or is caused by heating during bonding, a semiconductor module cannot be mounted on the mother board or the warp causes a partial failure in packaging. That is, a semiconductor module can be defective in packaging though it is non-defective in its electric characteristics. A module formed principally of memories, a combination of a DRAM and an SRAM and a combination of a DRAM and a flash memory, for example, needs to be embedded and controlling semiconductor devices for controlling these memories also need to be mounted. Accordingly, it is required to suppress a warp occurring when semiconductor chips having different thicknesses and characteristics are stacked.

On the other hand, in the conventional publications described above, only structures in which boards equipped with semiconductor chips having the same shape are stacked and techniques for obtaining the structures are disclosed. In the drawings of these publications, neither a structure in which two or more types of circuits are embedded nor a structure equipped with controlling semiconductor devices is disclosed. That is, in these conventional examples, though the stacked structure is disclosed, measures for suppressing a warp of a semiconductor module having a stacked structure are not disclosed.

It is an object of the present invention to provide a multi-level semiconductor module in which occurrence of a warp is suppressed and a method for fabricating the module.

To achieve the object, a multi-level semiconductor module according to the present invention is formed by alternately stacking resin boards and sheet members. Each of the resin boards includes one or more first buried conductors and has an upper face on which a semiconductor chip is mounted. Each of the sheet members has an opening for accommodation of the semiconductor chip and includes one or more second buried conductors electrically connected to the first buried conductors. One of the resin boards located at the bottom has a thickness larger than that of each of the other resin board or boards.

In this structure, the resin board at the bottom is thicker than the other resin boards, so that a warp occurring in fabricating a multi-level semiconductor module is suppressed. Accordingly, good connection is established between the multi-level semiconductor module of the present invention and a mother board.

Each of the sheet members includes a resin base and the second buried conductors provided around the opening, and the resin base has a thickness larger than that of the semiconductor chip. Accordingly, it is possible to apply sufficient pressure in stacking so that sufficient connection is established between the sheet members and the resin boards. In addition, connection failures and occurrence of breakage due to warp deformation are suppressed.

The first buried conductors are formed through each of the resin boards, and the second buried conductors connected to the first buried conductors project from upper and back faces of the resin base. Accordingly, when the projections of the resin boards are pressed from the above with a sufficient pressure maintained, the conductive resin material forming the second buried conductors is compressed, resulting in reduction of resistance of the conductors.

A plurality of external connection terminals for connection to external equipment may be formed on a back face of the resin board located at the bottom. The multi-level semiconductor module of the present invention is mounted to a mother board using, for example, solder balls or bumps. Bumps or solder balls formed as the external connection terminals may be formed over the entire surface of each of the resin boards or may be collectively formed on a given region. Since the multi-level semiconductor module of the present invention warps to small degree, the module is capable of being mounted with high yield even by such mounting methods.

The semiconductor chip provided with a semiconductor memory may be mounted on each of the resin board or boards except for the resin board located at the bottom, and the semiconductor chip mounted on the resin board at the bottom may be provided with a controlling semiconductor device for controlling the semiconductor memory. With this structure, a module including control of semiconductor memories is implemented. In addition, occurrence of mounting failures in mounting to a mother board is greatly suppressed. Accordingly, an expensive multi-level semiconductor module does not become defective in packaging, thus enabling cost reduction of electronic devices.

Out of the resin boards, at least one of the resin board located at the bottom and the resin board located at the top has a thickness larger than that of each of the semiconductor chip or chips mounted on the other resin board or boards. Accordingly, the semiconductor chips having high stiffness are thick with respect to the resin boards, so that occurrence of a warp is further suppressed.

The multi-level semiconductor module may further include a rigid plate having a thermal conductivity higher than that of the resin boards and located over one of the resin boards at the top. This structure improves the heat dissipation property of the multi-level semiconductor module and suppresses occurrence of a warp. In addition, in forming a semiconductor module, heat and pressure are applied via the rigid plate having high thermal conductivity, so that the resin boards and the sheet members are heated with a relatively-uniform temperature distribution. Accordingly, good connection is established between the resin boards and the sheet members and connection failures due to occurrence of a warp are prevented.

Each of the first buried conductors in the resin board or boards except for the resin boards located at the bottom and the top may have a diameter larger than that of each of the first buried conductors in the resin boards located at the bottom and the top. During application of pressure and heat, pressure and heat are not readily applied to resin boards and sheet members provided near the middle in the stacking direction. In the semiconductor module of the present invention, since the diameter of the first buried conductors near a center portion is increased, increase in connection resistance and variation of the total resistance value are suppressed even under application of an insufficient pressure to the resin boards and the sheet members. In addition, the increase of the diameter of the first buried conductors increases the thermal conductivity, so that a delay in curing the buried conductors is prevented.

Each of the second buried conductors in the sheet member or members except for the sheet members in contact with the resin boards located at the bottom and the top may have a diameter larger than that of each of the second buried conductors in the sheet members in contact with the resin boards located at the bottom and the top. In this case, increase of connection resistance near the middle in the stacking direction is also suppressed.

One or more electrode bumps are provided on a principal surface of the semiconductor chip, and each of the resin boards further includes: one or more connection terminals bonded to the electrode bumps; and one or more wires connecting the connection terminals to the first buried conductors. Accordingly, after the semiconductor chips have been mounted on the resin boards, a necessary electrical inspection and a necessary burn-in test are performed, and the resultant structure is confirmed to be non-defective before a module is formed.

The electrode bumps are provided on a center region of the semiconductor chip, and the wires are provided on each of an upper face and a back face of each of the resin boards. Accordingly, the degree of a warp caused by the difference in linear expansion coefficients between the resin boards and the semiconductor chips is greatly suppressed, so that it is possible to mount the stacked structure on, for example, a mother board with high yield.

The semiconductor chip further includes projections having an identical height and located at both ends of the principal surface, and each of the resin boards further includes one or more dummy electrodes in contact with the projections. Accordingly, the semiconductor chips are not tilted when being mounted on the resin boards. In addition, even when pressure is applied to the semiconductor chips after the mounting, the pressure is absorbed at the junctions between the projections and the dummy boards, so that occurrence of, for example, a crack in the semiconductor chips is suppressed.

Each of one or more of the first buried conductors connected to the electrode bumps may have a diameter larger than that of each of the other first buried conductor or conductors. For example, if the diameter of buried conductors connected to, for example, power sources and ground terminals of semiconductor devices, analog terminals or digital terminals for signals at 100 MHz or higher is increased, the resistance value of transmission lines is reduced and deterioration of electrical characteristics is prevented. For example, if the diameter of buried conductors connected to terminals of power-supply lines or high-speed-signal lines is increased, voltage drops and signal rounding are less likely to occur. In addition, variation of impedance and signal reflection due to mismatching that might occur among the levels of the semiconductor modules are prevented. If voltage drops are less likely to occur, Joule heat generated in buried conductors in using the module is reduced, resulting in suppressing generation of heat inside the semiconductor module.

The resin base forming each of the resin boards is preferably made of a mixture containing 70 wt % to 95 wt %, both inclusive, of an inorganic filler and a thermosetting resin.

A first method for fabricating a multi-level semiconductor module according to the present invention includes the steps of: (a) preparing one or more first resin boards, a second resin board and one or more sheet members, each of the first resin boards having an upper face on which a semiconductor chip is mounted and including one or more first buried conductors, the second resin board having an upper face on which a semiconductor chip is mounted, including one or more first buried conductors and having a thickness larger than that of each of the first resin boards, each of the sheet members having an opening for accommodation of an associated one of the semiconductor chips and including one or more second buried conductors; (b) placing the second resin board at the bottom and alternately stacking the sheet members and the first resin boards over the second resin board; and (c) applying heat and pressure to the first and second resin boards and the sheet members stacked at the step (b) from the top and the bottom of the stacked structure so as to bond the first and second resin boards and the sheet members together and to connect the first buried conductors and the second buried conductors to each other.

With this method, the second resin board thicker than the first resin boards is placed at the bottom where the highest pressure is likely to be applied, so that the degree of a warp of the semiconductor module occurring upon application of heat and pressure at the step (c) is reduced.

The first method further includes the step (d) of bonding a rigid plate having a thermal conductivity higher than that of each of the first and second resin boards over one of the first resin boards located at the top. Accordingly, during application of pressure and heat, the resin boards and the sheet members at the respective levels are heated with a relatively-uniform temperature distribution.

In the step (d), the amount of a warp of the multi-level semiconductor module occurring in the step (c) is obtained, and a material for the rigid plate is selected according to the obtained amount. Accordingly, the degree of a warp is further reduced.

A second method for fabricating a multi-level semiconductor module according to the present invention includes the steps of: (a) preparing one or more first resin boards, a second resin board and one or more sheet members, each of the first resin boards having an upper face on which a semiconductor chip is mounted and including one or more first buried conductors, the second resin board having an upper face on which a semiconductor chip is mounted, including one or more first buried conductors and having a thickness larger than that of each of the first resin boards, each of the sheet members having an opening for accommodation of an associated one of the semiconductor chips and including one or more second buried conductors; (b) placing the second resin board at the bottom and alternately stacking the sheet members and the first resin boards over the second resin board; (c) placing a rigid plate having a thermal conductivity higher than that of each of the first and second resin boards over one of the first resin boards located at the top; and (d) applying heat and pressure to the stacked structure of the first and second resin boards, the sheet members and the rigid plate from the top and the bottom of the stacked structure so as to bond the first and second resin boards and the sheet members together and to connect the first buried conductors and the second buried conductors to each other, after the step (c) has been performed. With this method, the semiconductor module may be formed by applying heat and pressure to the whole stacked structure after the placement of the rigid plate.

DETAILED DESCRIPTION OF THE INVENTION

Embodiment 1

A multi-level semiconductor module according to a first embodiment of the present invention will be described with reference to FIGS. 1, 2, 3A through 3C and 4A through 4C.

Figure 1:
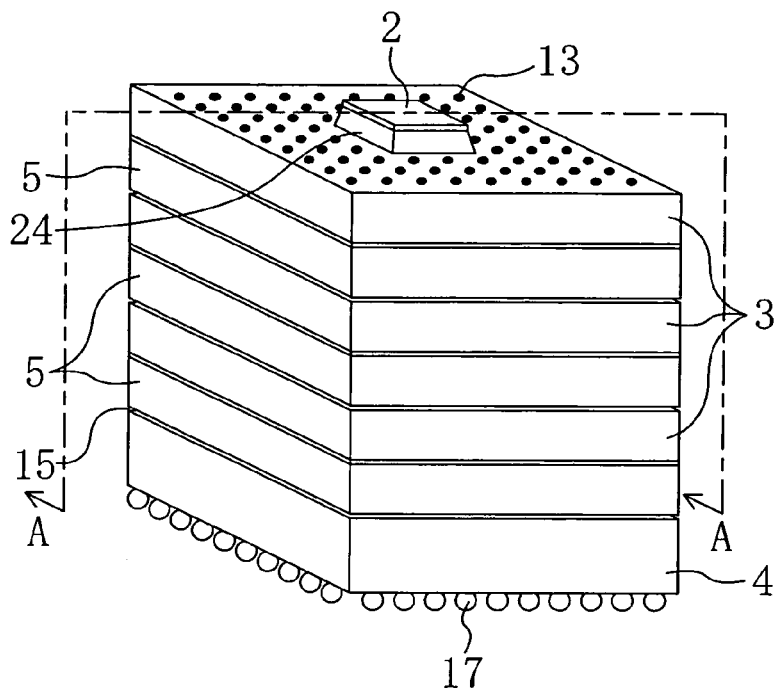
FIG. 1 is a perspective view schematically illustrating an overall structure of a semiconductor module according to a first embodiment of the present invention.
Figure 2:
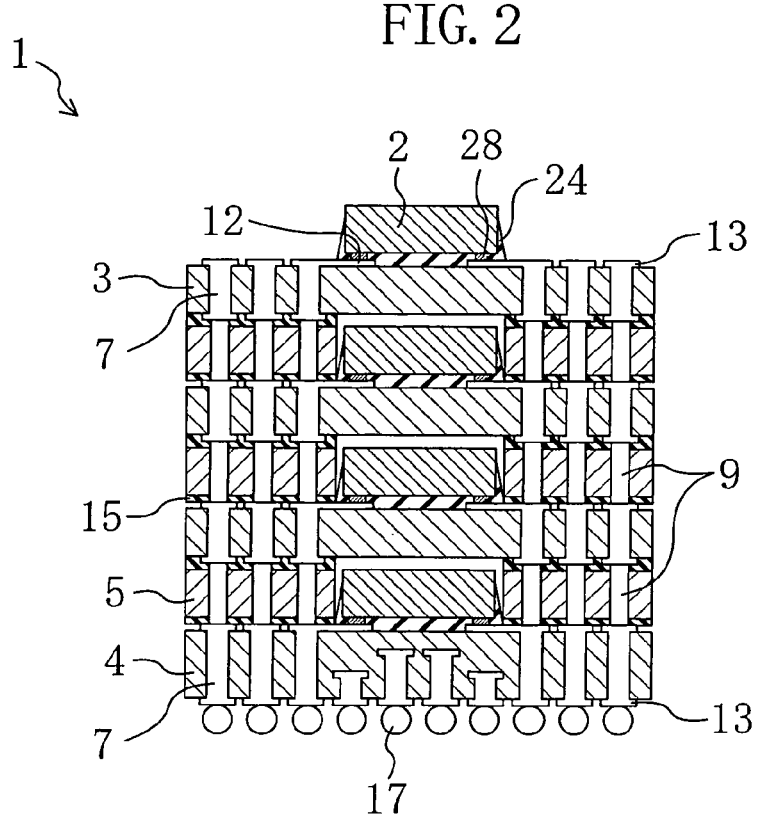
FIG. 2 is a cross-sectional view of the semiconductor module of the first embodiment taken along the line A-A in FIG. 1.
Figure 3A:
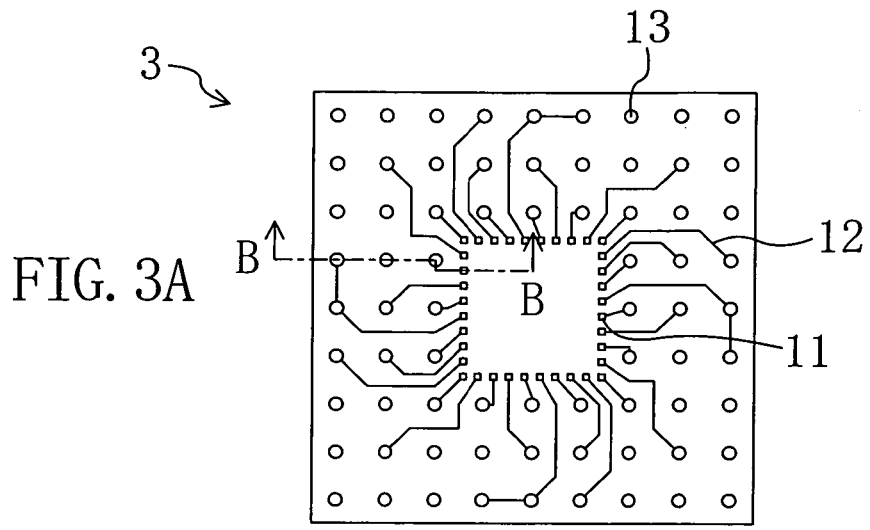
FIGS. 3A through 3C are a schematic plan view for explaining the shape of a resin board of the first embodiment, a partial cross-sectional view taken along the line B-B, and a plan view schematically illustrating the back face of the resin board, respectively.
Figure 3B:
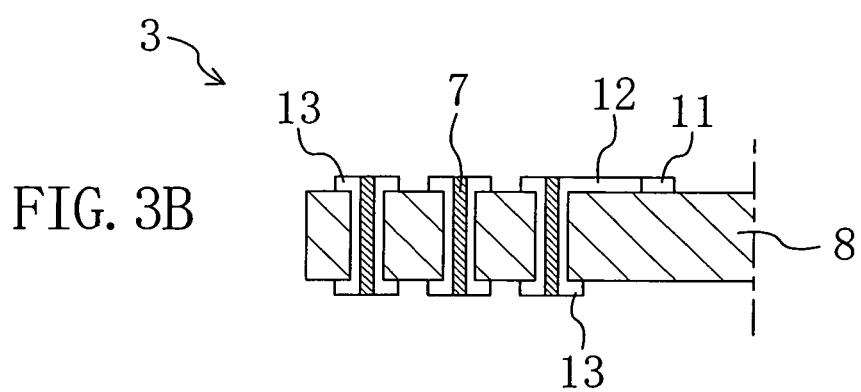
Figure 3C:
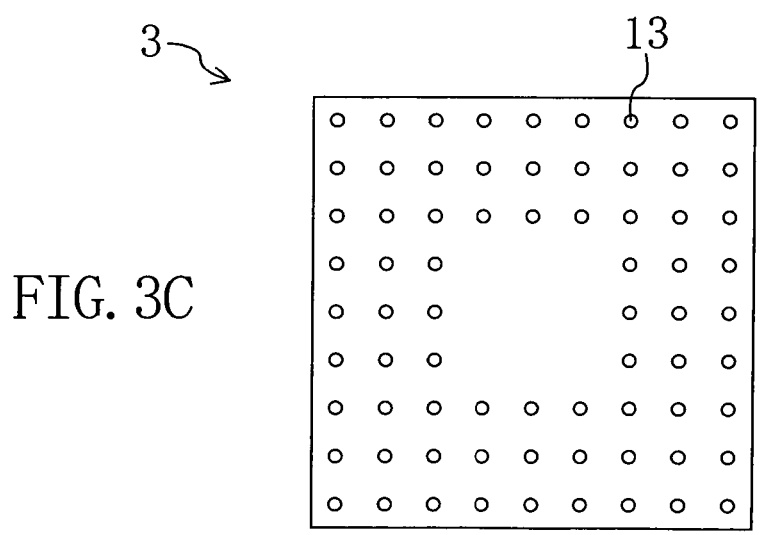
Figure 4A:
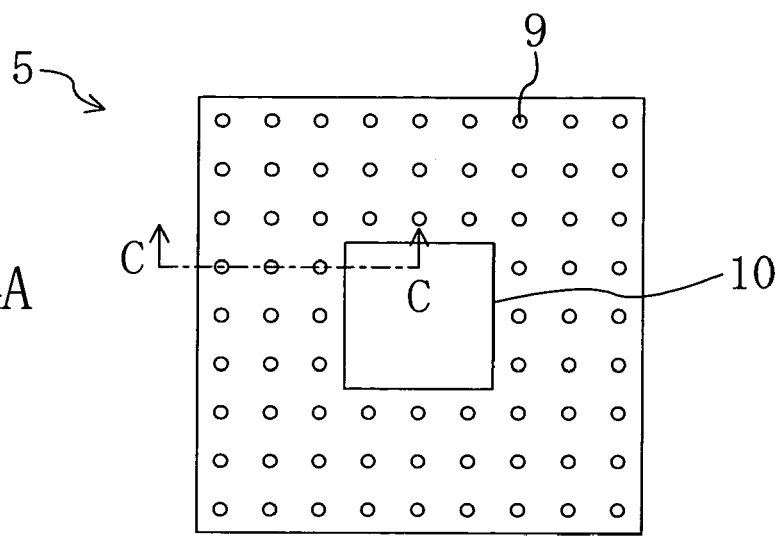
FIGS. 4A through 4C are schematic plan views and a partial cross-sectional view for explaining the shape of a sheet member of the first embodiment.
Figure 4B:
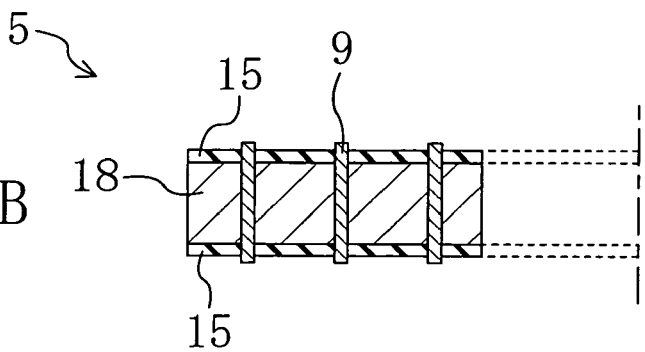
Figure 4C:
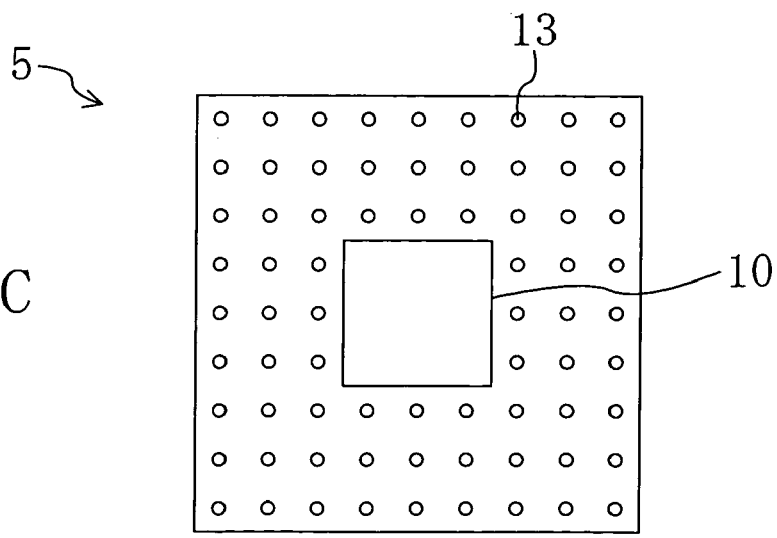

FIG. 1 is a perspective view schematically illustrating an overall structure of a semiconductor module 1 according to this embodiment of the present invention. FIG. 2 is a cross-sectional view taken along the line A-A in FIG. 1. FIGS. 3A through 3C are a plan view schematically illustrating the shape of a resin board of this embodiment, a partial cross-sectional view taken along the line B-B, and a plan view schematically illustrating the back face of the resin board, respectively. FIGS. 4A through 4C are schematic plan views and a partial cross-sectional view for explaining the shape of a sheet member. In these drawings, the thicknesses, lengths and shapes, for example, of parts of the semiconductor module are selected so as to be easily shown, and therefore are different from those of actual parts. The numbers and shapes of buried conductors and external connection terminals for external connection are different from those of actual conductors and terminals and are selected to be easily shown in the drawings.

As illustrated in FIGS. 1 and 2, the semiconductor module 1 of this embodiment is formed by alternately stacking first resin boards 3 and sheet members 5. A semiconductor chip 2 is mounted on the upper face of each of the first resin boards 3. In the semiconductor module 1, the resin board at the bottom is thicker than the other resin boards and external connection terminals are provided on the back face of the bottom resin board. The semiconductor module 1 has a stacked structure made of the first resin boards 3, the second resin board 4 and the sheet members 5 that are united by applying heat and pressure. To distinguish between the bottom resin board and the other resin boards, the bottom resin board is referred to as the second resin board 4 and the other resin boards are referred to as the resin boards 3 in the following description.

The structure of the semiconductor module of this embodiment will be further specifically described.

As illustrated in FIGS. 2 and 3A through 3C, each of the first resin boards 3 in the multi-level semiconductor module 1 of this embodiment includes: a first resin base (a first resin core) 8; a plurality of semiconductor-device connecting terminals 11 formed on a center region of the first resin base 8 and used for establishing connection to a semiconductor chip 2; a plurality of first buried conductors 7 formed in a peripheral portion of the first resin base 8 and penetrating the first resin base 8; connecting lands 13 provided around both ends of the respective buried conductors 7; and a plurality of wires 12 connecting the semiconductor-device connecting terminals 11 to the connecting lands 13 and the first buried conductors 7.

As a material for the first buried conductors 7, a conductive resin material or a plated conductor is used. A base made of a thermosetting resin and a reinforcing material may be used as the first resin base (first resin core) 8. As the thermosetting resin, at least one material selected from the group consisting of an epoxy resin, a polyimide resin, a polyphenylene ether resin, a phenol resin, a fluorocarbon resin and an isocyanate resin may be used. As the reinforcing material, a woven or nonwoven fabric made of glass fibers or a woven or nonwoven fabric made of aramid fibers, which are organic fibers, may be used.

The second resin board 4 has a structure similar to that of the first resin boards 3 as a whole, and includes: the first resin base 8; the semiconductor-device connecting terminals 11; and the first buried conductors 7. However, the second resin board 4 is thicker than each of the first resin boards 3 and has a structure in which solder balls 17 are formed on lands, serving as external connection terminals for connection to a mother board, at given intervals on the back face of the board. The semiconductor module is bonded to the mother board using the solder balls 17.

The semiconductor chips 2 are connected to the semiconductor-device connecting terminals 11 of the first resin boards 3 and the second resin board 4 through electrode bumps 28, and the peripheries of the semiconductor chips 2 are protected by a sealing resin 24. The sealing resin 24 protects the circuit surfaces (i.e., the lower face in FIG. 1) of the semiconductor chips 2 against external environment and absorbs a thermal distortion, for example.

As illustrated in FIGS. 2 and 4A through 4C, each of the sheet members 5 includes: a second resin base (a second resin core) 18; adhesive layers 15 formed on both sides of the second resin base 18; and second buried conductors 9 provided at positions corresponding to the first buried conductors 7 of the first resin boards 3 and made of a conductive resin material. An opening 10 capable of accommodating the semiconductor chip 2 is formed in a center region of the second resin base 18. The second buried conductors 9 penetrate the second resin base 18, and both ends of the second buried conductors 9 project from the surfaces of the second resin base 18 to a given height. The adhesive layers 15 may be made of a prepreg base obtained by impregnating a reinforcing material made of a glass woven fabric or an aramid nonwoven fabric with an epoxy resin or a thermoplastic resin that is dissolved and softened by applying pressure and heat. The thermoplastic resin may be an organic film, for example, and is exemplified by wholly aromatic polyester, a fluorocarbon resin, a polyphenylene oxide resin, a syndiotactic polystyrene resin, a polyimide resin, a polyamide resin, an aramid resin and a polyphenylene sulfide resin. The second buried conductors 9 are semi-cured before being stacked. The second buried conductors 9 are pressed and cured by application of pressure and heat after having been stacked, and establish electrical connection to the first buried conductors 7 in the first resin boards 3 and the second resin board 4 mainly by mechanical contact.

In this manner, the multi-level semiconductor module 1 of this embodiment is formed. The first resin bases 8 forming the first resin boards 3 and the second resin board 4 and the second resin bases 18 forming the sheet members 5 may be made of the same material such as a glass-epoxy resin or an aramid-epoxy resin. Alternatively, the first resin bases 8 and the second resin bases 18 may be made of different materials. For example, a glass-epoxy resin may be used as the bases for the first resin boards 3 and the second resin board 4 and an aramid-epoxy resin may be used as the bases for the sheet members 5. The outer dimensions of the first resin boards 3, the second resin board 4 and the sheet members 5 are the same in plan view.

An example of the shapes of main portions of components of the multi-level semiconductor module 1 of this embodiment will be hereinafter described.

The entire shape of the semiconductor module is, for example, a rectangular solid. The thickness of each of the semiconductor chips 2 is preferably in the range from 30 μm to 150 μm, both inclusive. The thickness of each of the first resin boards 3 is in the range from 60 μm to 200 μm, both inclusive. Each of the first buried conductors 7 has a diameter ranging from 50 μm to 500 μm, both inclusive. The first buried conductors 7 are arranged at a pitch ranging from 100 μm to 750 μm, both inclusive. Using these ranges, the semiconductor module is appropriately designed.

The thickness of the second resin board 4 is in the range from 100 μm to 300 μm, both inclusive, and larger than that of at least each of the first resin boards 3. The diameter and pitch of the first buried conductors 7 in the second resin board 4 are the same as those in the first resin boards 3.

The thickness of each of the second resin bases 18 as a component of the sheet members 5 is in the range from 45 μm to 200 μm, both inclusive. An adhesive layer having a thickness ranging from 10 μm to 100 μm, both inclusive, is provided on each face of the second resin bases 6. The diameter and pitch of the second buried conductors 9 in each of the sheet members 5 are the same as those in the first resin boards 3. Based on the design using the ranges described above, the multi-level semiconductor module 1 of this embodiment is fabricated.

With the structure of the multi-level semiconductor module 1 of this embodiment, a necessary electrical inspection and a necessary burn-in test are performed on the first resin boards 3 and the second resin board 4 after mounting of the semiconductor chips 2 so that only non-defective boards are used. After the first resin boards 3, the second resin board 4 and the sheet members 5 have been stacked, the second buried conductors 9 in the sheet members 5 are compressed and cured by application of pressure and heat, so that electrical connection to the first buried conductors 7 and reduction of the resistance of the second buried conductors 9 are achieved at the same time. In addition, since the sheet members 5 are thicker than the semiconductor chips 2, no loads are applied to the semiconductor chips 2 even under application of pressure. Accordingly, even when a warp occurs in the module, no failures occur in the semiconductor chips 2 and at the junctions thereof. Furthermore, the second buried conductors 9 protruding from the upper face and the back face of the sheet member are pressed by the resin board, so that the conductive resin material forming the second buried conductors 9 of the sheet member 5 is compressed and the resistance of the buried conductors is reduced. Accordingly, even when a warp occurs in the module, no electrical failures occur at the junction of the buried conductors.

Since the second resin board 4 is thicker than the first resin boards 3 in the semiconductor module of the present invention, the degree of a warp is greatly reduced even in the multi-level structure. As a result, failures are less likely to occur in mounting the stacked structure on a mother board using the solder balls 17, so that high reliability is achieved at low cost.

Now, a method for fabricating the semiconductor module of this embodiment will be described with reference to the drawings. FIGS. 5A through 5C, FIGS. 6A through 6D, FIGS. 7A through 7D and FIG. 8 are cross-sectional views illustrating process steps of fabricating the semiconductor module of this embodiment.

First, a method for obtaining a semiconductor chip 2 having a given shape will be described with reference to FIGS. 5A through 5C.

Figure 5A:
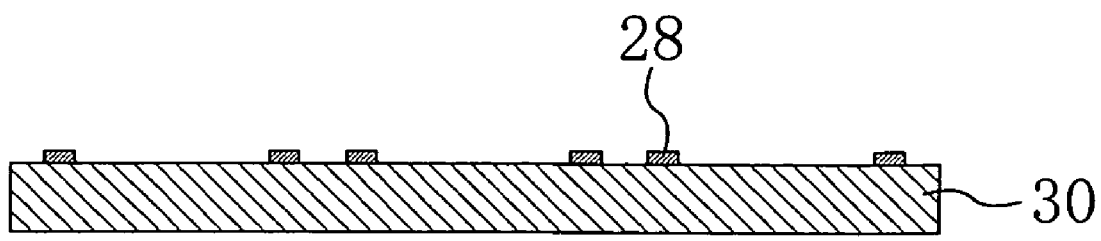
FIGS. 5A through 5C are cross-sectional views illustrating process steps of fabricating the semiconductor module of the first embodiment.

As illustrated in FIG. 5A, electrode bumps 28 are formed by, for example, electroplating or stud bump bonding (SBB) on bonding pads on the principal surfaces of a plurality of semiconductor chips 2 in a semiconductor wafer 30 that has been subjected to a circuit formation process necessary for the semiconductor chips.

Figure 5B:
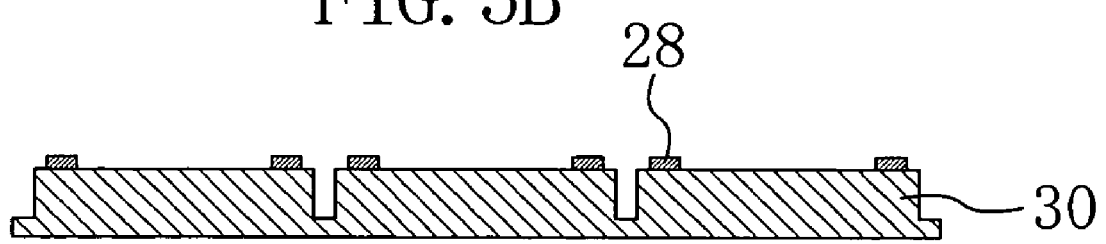

Then, as illustrated in FIG. 5B, the semiconductor wafer 30 is cut halfway by a dicing saw or a laser from the principal surface in a separation zone thereof located between the semiconductor chips 2.

Figure 5C:
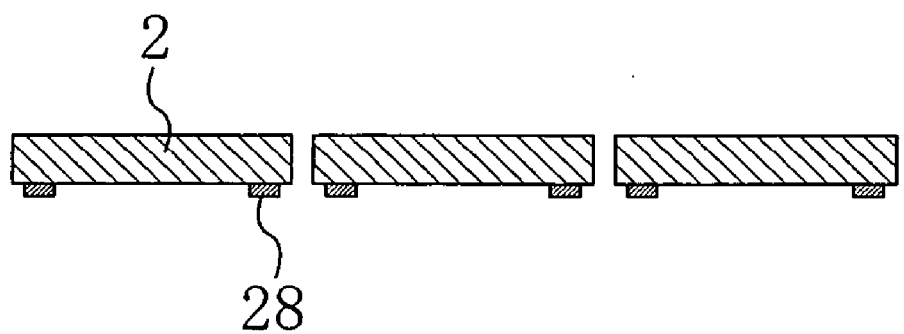

Thereafter, as illustrated in FIG. 5C, a back-face portion of the semiconductor wafer 30 is removed by a method such as chemical etching, back-face polishing, plasma etching or a method using these techniques so that the thickness of the semiconductor wafer is reduced to the range from about 30 μm to about 150 μm, both inclusive, thereby separating the semiconductor chips 2 from each other. The method illustrated in FIGS. 5A through 5C is an example, and the present invention does not depend on the method for separating the semiconductor chips 2.

Next, an example of a method for fabricating the first resin boards 3 and the second resin board 4 for mounting the semiconductor chips 2 will be described with reference to FIG. 6A through 6D. Hereinafter, one of the first resin boards 3 is used as an example. In the following example, a glass-epoxy resin is used as the first resin base 8 forming the first resin board 3 and a copper foil is used as the wires 12 and the connecting lands 13.

Figure 6A:
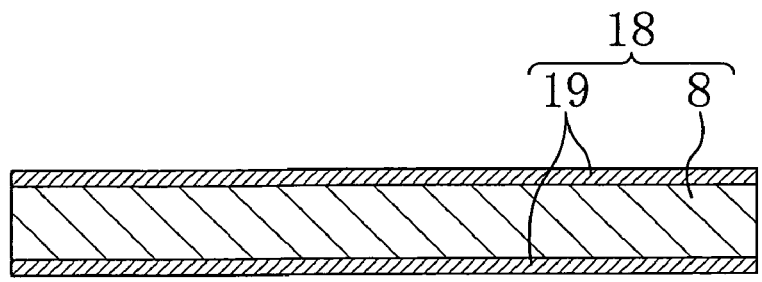
FIGS. 6A through 6D are cross-sectional views illustrating process steps of fabricating the semiconductor module of the first embodiment.

As illustrated in FIG. 6A, a two-side copper-clad board 29 formed by covering both faces of the first resin base 8 with copper foils 19 is prepared. In the two-side copper-clad board 29, the copper foils 19 each having a thickness of 18 μm are bonded to the faces of the first resin base 8 having a thickness of 70 μm, so that the total thickness of the two-side copper-clad board 29 is 106 μm.

Figure 6B:
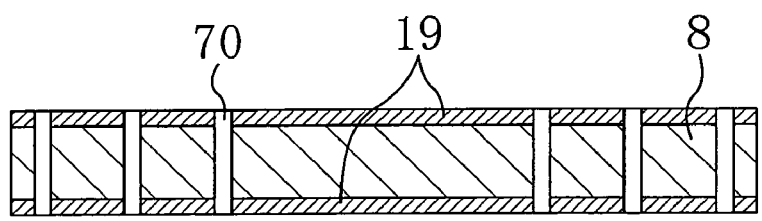

Then, as illustrated in FIG. 6B, a photosensitive film (not shown) is attached to one face of the two-side copper-clad board 29 and the copper foils 19 are partially removed from given portions. Thereafter, through holes 70 are formed with a carbon dioxide laser or a drill in portions from which the copper foils 19 have been removed.

Figure 6C:
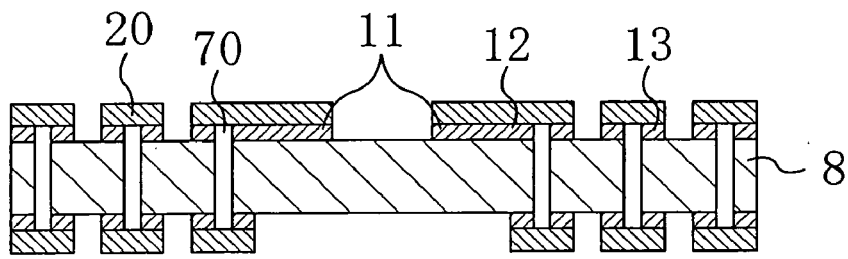

Subsequently, as illustrated in FIG. 6C, photosensitive films 20 are attached to both faces of the two-side copper-clad board 29, and semiconductor-device connecting terminals 11, connecting lands 13 and wires 12 connecting the semiconductor-device connecting terminals 11 and the connecting lands 13 are formed on one face of the first resin base 8. Connecting lands 13 are formed on the other face of the first resin base 8. These components are formed by photolithography and etching using the photosensitive films 20. Thereafter, the photosensitive films 20 are peeled off from the both faces.

Figure 6D:
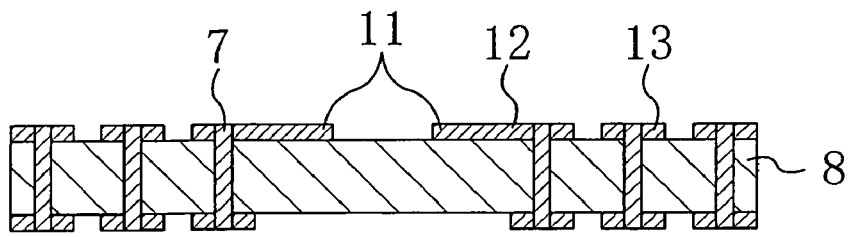

Thereafter, as illustrated in FIG. 6D, the through holes 70 are filled with, for example, a conductive paste. This conductive paste is cured with heat, thereby obtaining a first resin board 3 including first buried conductors. The filling with the conductive paste may be performed before photolithography and etching using the photosensitive films 20, i.e., after the through holes have been formed with a carbon dioxide laser. The first resin boards 3 and the second resin board 4 are not necessarily formed by the method described above and may be formed by a method for forming a usual two-side circuit board and by using usual materials.

Next, a method for forming sheet members 5 will be described with reference to FIGS. 7A through 7D. A glass fabric epoxy resin, for example, thicker than the semiconductor chip 2 is used as a second resin base 18 forming the sheet member 5.

Figure 7A:
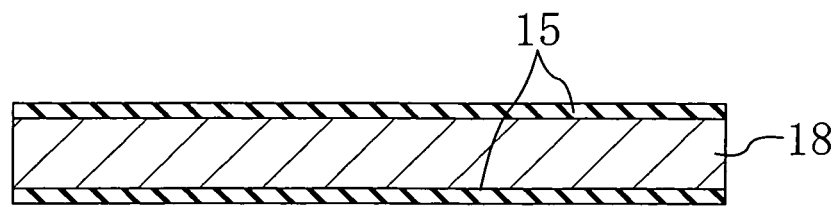
FIGS. 7A through 7D are cross-sectional views illustrating process steps of fabricating the semiconductor module of the first embodiment.

Specifically, as illustrated in FIG. 7A, if the thickness of the semiconductor chip 2 is 75 μm, the thickness of the second resin base 18 is preferably about 100 μm. Adhesive layers 15 made of a prepreg of an epoxy resin or another thermosetting resin and each having a thickness of about 15 μm are formed on both faces of the second resin base 18.

Figure 7B:
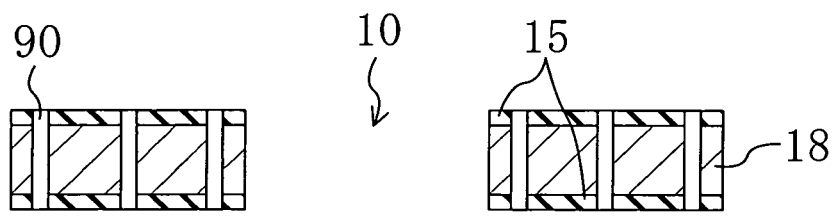

Thereafter, as illustrated in FIG. 7B, through holes 90 are formed in given portions of the second resin base 18 with a laser. Simultaneously with the formation of the through holes 90, an opening 10 capable of accommodating the semiconductor chip 2 is formed in a center region of the second resin base 18. In this process, the through holes 90 are filled with a conductive paste using a masking film 21 for the through holes 90. Alternatively, a technique of forming the through holes 90 with a laser and then filling the through holes 90 with a conductive paste by a squeezing process is also effective.

Figure 7C:
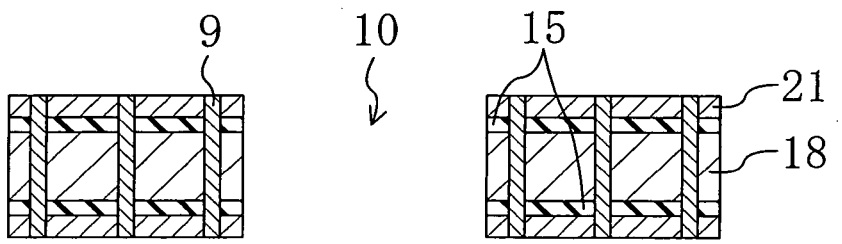

Then, as illustrated in FIG. 7C, masking films 21 are attached to both faces of the second resin base 18, and then the through holes 90 are filled with a conductive paste by, for example, screen printing.

Figure 7D:
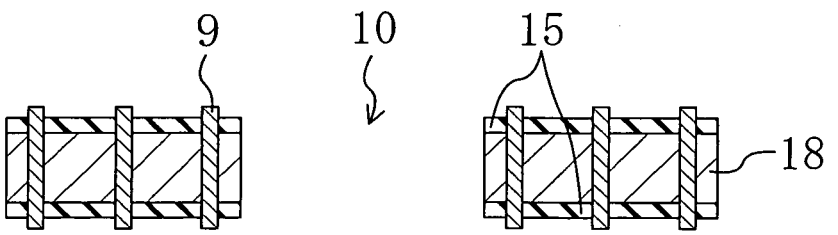

Subsequently, as illustrated in FIG. 7D, the conductive paste is dried, and then the masking films 21 are peeled off, thereby forming a sheet member 5. The second buried conductors 9 filled with the conductive paste are still semi-cured, so that the second buried conductors 9 have the property of being compressed and cured simultaneously upon application of pressure and heat and form projections corresponding to the thickness of the masking films. The masking films 21 may be organic films and may be made of wholly aromatic polyester, a fluorocarbon resin, a polyphenylene oxide resin, a syndiotactic polystyrene resin, a polyamide resin, an aramid resin and a polyphenylene sulfide resin, in addition to the materials described above.

Then, semiconductor chips 2 are mounted on the first resin boards 3 and the second resin board 4. To mount the semiconductor chips 2, the electrode bumps 28 of the semiconductor chips 2 are bonded to the semiconductor-device connecting terminals 11 of the first resin boards 3 and the second resin board 4 using, for example, solder or a conductive resin. Though not shown, the semiconductor chips 2 may, of course, be connected to the semiconductor-device connecting terminals 11 by wire bonding. Then, a sealing resin 24 is applied onto the semiconductor chips 2 and is cured so that gaps formed after bonding are filled therewith. In this manner, first resin boards 3 and a second resin board 4 on which the semiconductor chips 2 are mounted are formed. If an electrical inspection and a burn-in test are performed in subsequent processes, a semiconductor module having reliability similar to that of a usual packaged semiconductor module is obtained.

Figure 8:
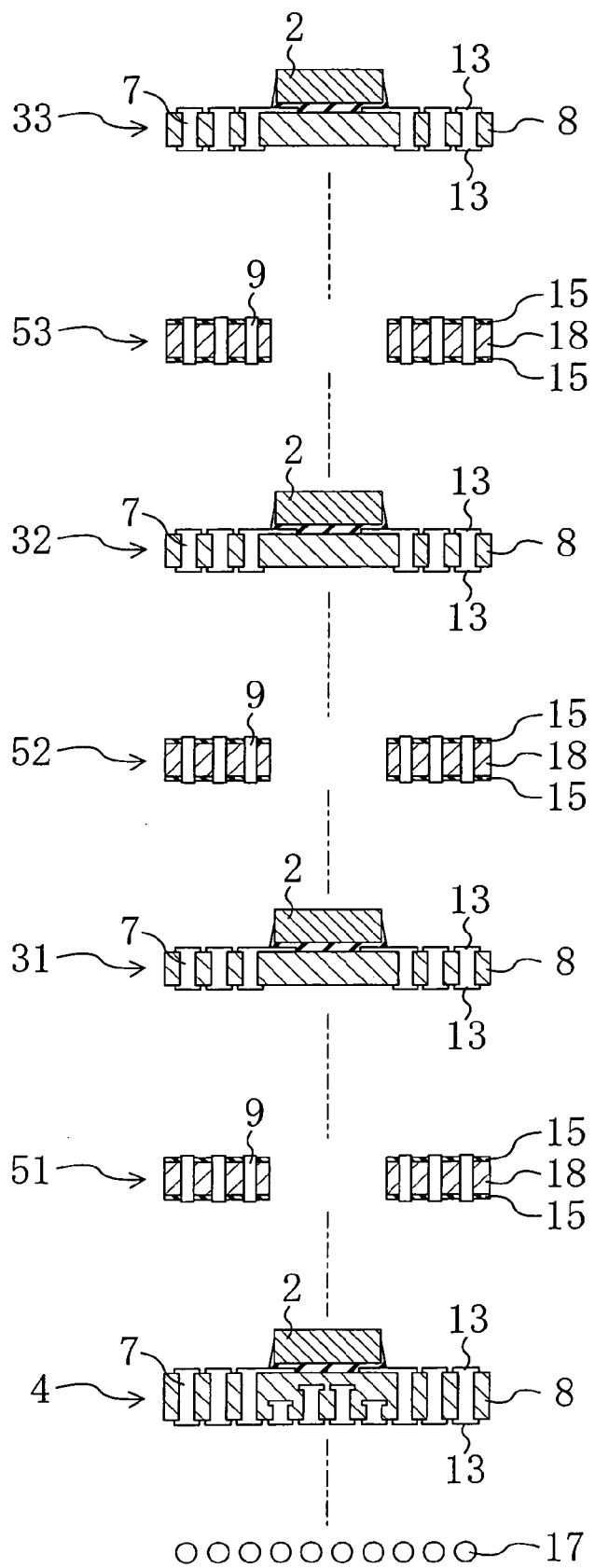
FIG. 8 is a view illustrating the semiconductor module of the first embodiment illustrated in FIG. 1 in a disassembled state.

Then, a process of stacking and uniting the first resin boards 3 and the second resin board 4 on which the semiconductor chips 2 are mounted and the sheet members 5 will be described with reference to FIG. 8. FIG. 8 is a view illustrating the stacked structure illustrated in FIG. 1 in a disassembled state. In FIG. 8, to simplify description, the first resin boards 3 are individually referred to as a first-level first resin board 31, a second-level first resin board 32 and a third-level first resin board 33. Likewise, the sheet members 5 are referred to as a first-level sheet member 51, a second-level sheet member 52 and a third-level sheet member 53.

As illustrated in FIG. 8, the second resin board 4 is located at the bottom and the first-level sheet member 51 is located on the second resin board 4. The first-level first resin board 31 is located on the first-level sheet member 51. The second-level sheet member 52, the second-level first resin board 32, the third-level sheet member 53 and the third-level first resin board 33 are stacked in this order on the first-level first resin board 31.

These components are stacked such that the semiconductor chips 2 mounted on the first resin boards 3 and the second resin board 4 overlap each other in plan view. The first resin boards 3 and the second resin board 4 are placed such that the semiconductor chips 2 are held in the openings 10 of the sheet members 5. The connecting lands 13 of the first resin boards 3 and the second resin board 4 are accurately positioned with respect to the projections of the second buried conductors 9 of the sheet members 5.

The resin boards and the sheet members are stacked in the manner described above and are made in close contact with each other, and then heat and pressure are applied in the atmosphere. Then, the adhesive layers 15 provided in the first-, second- and third-level sheet members 51, 52 and 53 are softened, thereby bonding the second resin board 4, the first resin boards 3 and the sheet members together.

In addition, the second resin board 4 is brought into mechanical contact with the first-level first resin board 31, and the connecting lands 13 of the second-level first resin board 32 and the third-level first resin board 33 are brought into mechanical contact with the second buried conductors 9 of the sheet members 5, thereby establishing electrical contact. That is, pressure and heat are applied to the stacked structure of the resin boards and the sheet members, so that the adhesive layers 15 are softened, the conductive paste is compressed, the through holes is filled with the compressed conductive paste with high density, and the connecting lands 13 and the second buried conductors 9 are in good contact with each other, thereby achieving connection with low resistance. If the resultant structure is cooled and taken out after application of pressure and heat in a given period, a multi-level semiconductor module obtained by stacking and uniting components is obtained.

Thereafter, solder balls 17 are bonded to the connecting lands 13 formed on the back face of the second resin board 4, thereby obtaining a multi-level semiconductor module 1 capable of being mounted on a mother board. In the foregoing method for fabricating the semiconductor module 1 of this embodiment, the second resin board is made thick. Accordingly, a warp is less likely to occur in the cases of using the multi-level semiconductor module 1 and mounting the module on a mother board. As a result, connection reliability within the semiconductor module 1 is enhanced and the reliability in connection to the mother board is also enhanced.

In the semiconductor module 1 of this embodiment, the types of semiconductor chips to be mounted are not specifically limited. For example, semiconductor chips provided with semiconductor memories may be mounted on the first resin boards 3 located at the second and higher levels and a semiconductor chip provided with a controlling semiconductor device for controlling these semiconductor memories may be mounted on the second resin board 4.

Embodiment 2

Figure 9:
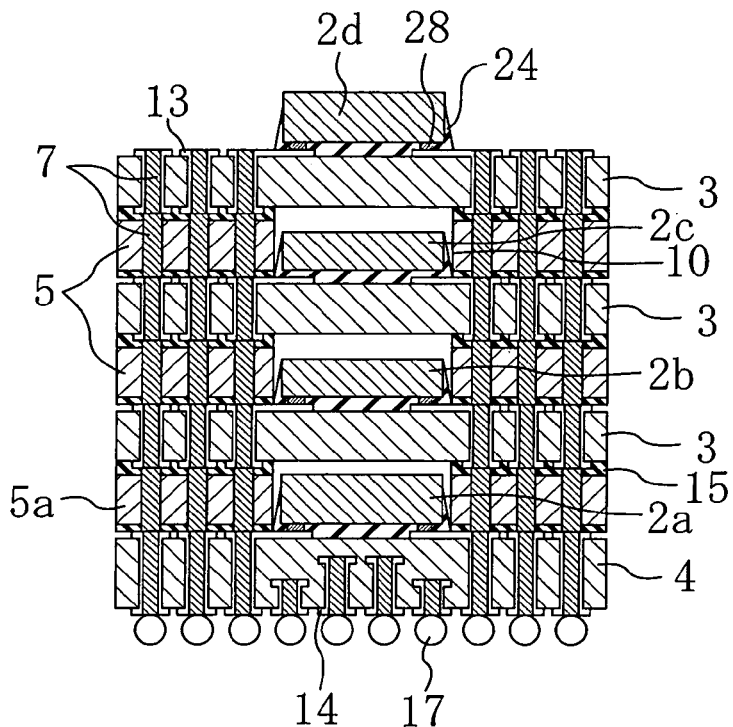
FIG. 9 is a cross-sectional view illustrating a semiconductor module according to a second embodiment of the present invention.

Hereinafter, a multi-level semiconductor module 100 according to a second embodiment of the present invention will be described with reference to FIG. 9.

The semiconductor module 100 of this embodiment has a characteristic in which a semiconductor chip 2d mounted on a first resin board 3 located at the top and a semiconductor chip 2a mounted on a second resin board 4 located at the bottom are thicker than semiconductor chips 2b and 2c mounted on the other first resin boards 3. Accordingly, the lowest-level sheet member 5a is thicker than the other sheet members 5 in the semiconductor module 100 of this embodiment. With respect to the other aspects, the semiconductor module 100 of this embodiment is the same as the semiconductor module 1 of the first embodiment, and description thereof will be omitted. Likewise, in the following embodiments, only aspects different from those of the preceding embodiments will be described.

With the structure of the semiconductor module 100 described above, the stiffness of the semiconductor chips 2a and 2d is increased, so that a warp occurring in formation of a module is suppressed. In addition, since the semiconductor chips 2a and 2d located at the top and bottom to which pressure is readily applied during application of pressure and heat are thick, cracks or the like are less likely to occur even under application of pressure to the semiconductor chips.

In this embodiment, the semiconductor chips 2a and 2d located at the top and bottom are thicker than the other semiconductor chips. However, only one of the semiconductor chips 2a and 2d may be thick. Even in this case, the effect of suppressing occurrence of, for example, cracks is still achieved.

Embodiment 3

A multi-level semiconductor module 110 according to a third embodiment of the present invention will be described with reference to FIG. 10.

Figure 10:
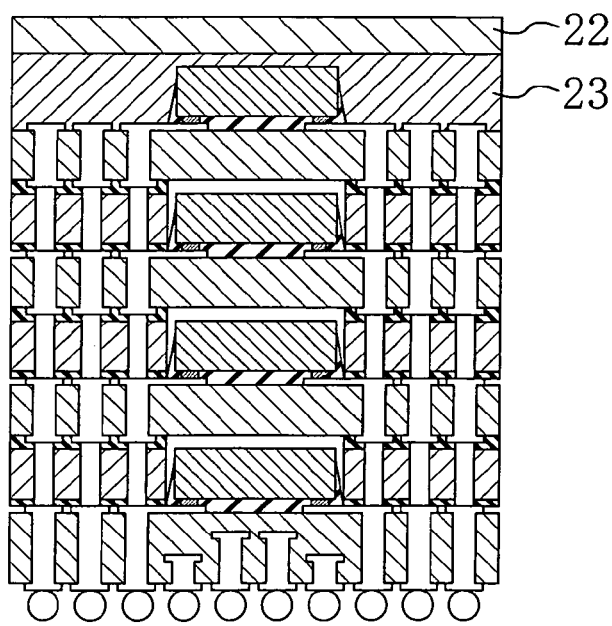
FIG. 10 is a cross-sectional view illustrating a semiconductor module according to a third embodiment of the present invention.

FIG. 10 is a cross-sectional view illustrating a semiconductor module of this embodiment. As illustrated in FIG. 10, the semiconductor module 110 of this embodiment has a characteristic in which a rigid plate 22 having the same area as that of the first resin boards 3 is attached to the top of the semiconductor module 1 of the first embodiment. Specifically, in the semiconductor module 110 of this embodiment, a base 23 having an opening capable of accommodating a semiconductor chip 2 and a rigid plate 22 having the same shape as that of the first resin boards 3 and a thermal conductivity higher than that of the first resin boards 3 are further provided on the first resin board 3 located at the top, in addition to the components of the semiconductor module 1 of the first embodiment. To bond the base 23 and the rigid plate 22, these base 23 and the rigid plate 22 are stacked together with the other components and the resultant stacked structure is united by application of pressure and heat. Alternatively, after a multi-level semiconductor module has been formed, the base 23 and the rigid plate 22 may be attached to the module.

The rigid plate 22 may be a metal plate made of a material having a high stiffness and a high thermal conductivity such as copper, iron, aluminum or 42 alloy or may be, for example, a ceramic material such as zirconia or a plastic plate containing a metal powder.

In addition, a warp of the multi-level semiconductor module 1, for example, may be measured after application of heat and pressure so that the thickness and material of the rigid plate are selected so as to cancel this warp. Alternatively, in fabricating the module under given conditions, when it is found that a warp occurs in one direction, a rigid place for canceling this warp may be placed at the top before application of pressure and heat. To cancel a warp, it is sufficient to calculate the thickness of a material having a linear expansion coefficient different from those of the base, the resin boards and the sheet members according to the direction of the warp.

Figure 11:
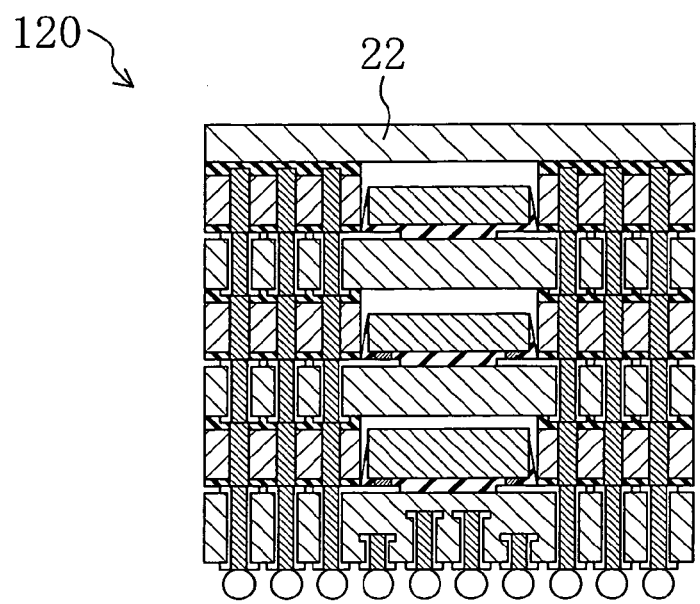
FIG. 11 is a cross-sectional view illustrating a modified example of the semiconductor module of the third embodiment.

FIG. 11 is a view illustrating a modified example of the multi-level semiconductor module of this embodiment.

As illustrated in FIG. 11, a semiconductor module 120 according to this modified example has a characteristic in which the rigid plate 22 is bonded instead of the first resin board 3 located at the top in the semiconductor module 1 of the first embodiment. In this example, as the rigid plate 22, a plate including an insulating layer at least at the surface thereof is used. In this structure, a material having the property of canceling a warp may also be selected as the rigid plate 22.

With the structures of the rigid plates of the foregoing examples, even in a stacked structure using resin boards whose reliability has been confirmed through inspections such as a burn-in test after mounting, failures are less likely to occur in stacking, and the degree of a warp of the resultant module is reduced. In particular, a rigid plate is selected according to a warp occurring after resin boards and sheet members have been stacked, so that a warp is completely eliminated.

A method for fabricating the semiconductor module 110 according to this embodiment is different from that of the first embodiment only in the structure of an upper portion during stacking under application of pressure. Specifically, in FIG. 8, a process of bonding, to a resin board located at the top, a rigid plate having a thermal conductivity higher than this resin board using an adhesive material may be added. Alternatively, a process of placing, in stead of the resin board located at the top, a rigid plate having a thermal conductivity higher than that of the resin board on the stacked structure and then applying pressure and heat may be employed. In particular, in the case of applying heat and pressure after bonding the rigid plate 22, a relatively-uniform temperature distribution occurs in the resin boards and the sheet members. Since the rigid plate has a stiffness higher than the resin boards, pressure is uniformly applied to the components during pressure application.

With the foregoing methods, even in stacking resin boards whose reliability has been confirmed through inspections such as a burn-in test after mounting, failures are less likely to occur in stacking and, in addition, the degree of a warp of the resultant module is reduced.

Embodiment 4

A multi-level semiconductor module 130 according to a fourth embodiment of the present invention will be described with reference to FIG. 12.

Figure 12:
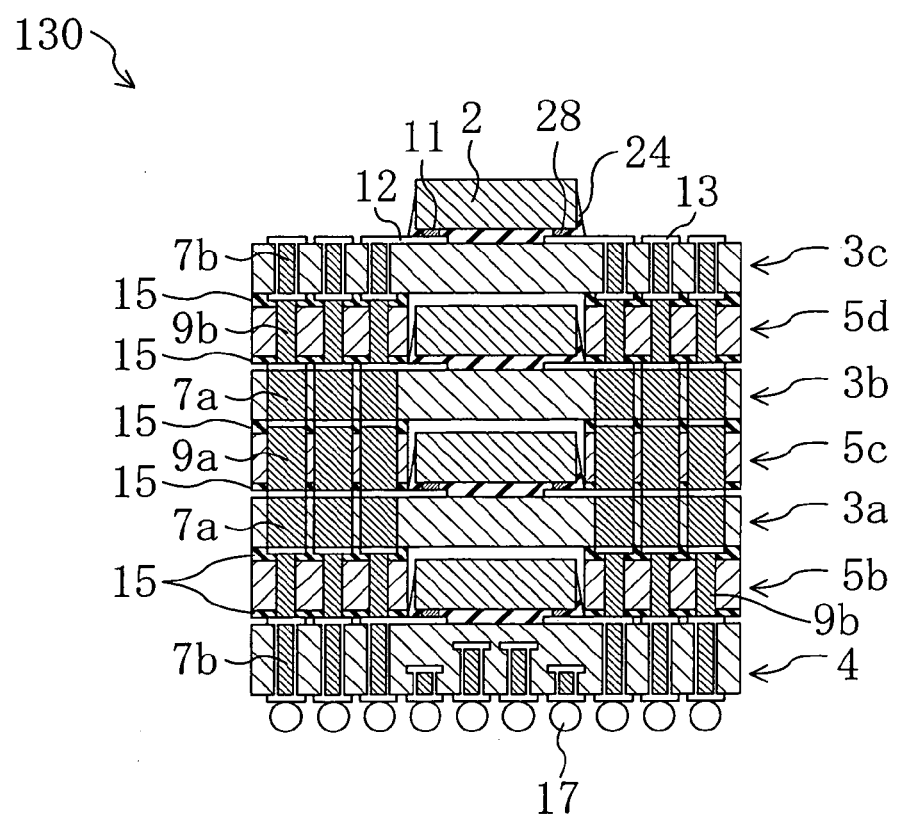
FIG. 12 is a cross-sectional view illustrating a semiconductor module according to a fourth embodiment of the present invention.

FIG. 12 is a cross-sectional view illustrating the semiconductor module of this embodiment. As illustrated in FIG. 12, in the semiconductor module 130 of this embodiment, the diameter of second buried conductors 9a in a sheet member 5c at an intermediate level is larger than that of second buried conductors 9b in sheet members 5b and 5d at an upper level and a lower level. The diameter of first buried conductors 7a in the first resin boards 3a and 3b at intermediate levels may be larger than that of first buried conductors 7b in a first resin board 3c and a second resin board 4 located at an upper level and a lower level, according to the second buried conductors 9a.

In this manner, in a process in which first resin boards 3 and sheet members 5 are alternately stacked with a second resin board 4 placed at the bottom and then this stacked structure is united by application of heat and pressure, the resistance of the second buried conductors 9a at the intermediate level is reduced. Accordingly, even if insufficient pressure and heat are applied to the intermediate level as compared to upper and lower levels, the resistance of the buried conductors is reduced. In a conventional multi-level semiconductor module, pressure is not sufficiently applied to resin boards and sheet members located near the middle, so that the second conductive resin material is not sufficiently compressed or, because of this, connection resistance of part of buried conductors increases in some cases. In addition, when a warp of the semiconductor module occurs, these problems are exacerbated.

On the other hand, if the diameter of the second buried conductors 9a in a sheet member at an intermediate level is increased as in the semiconductor module of this embodiment, connection resistance is reduced irrespective of variation of applied pressure among the stacked sheet members 5 and, even when the resistance increases by application of insufficient pressure, a margin for compensating this increase is secured. In addition, the increase of diameter causes thermal conductivity in the semiconductor module to increase under application of heat and pressure, thus preventing a delay in curing. In this manner, in the semiconductor module of this embodiment, a drawback caused by a warp is effectively prevented.

Embodiment 5

A multi-level semiconductor module according to a fifth embodiment of the present invention will be described with reference to FIGS. 13A, 13B, 14A, 14B and 15.

Figure 13A:
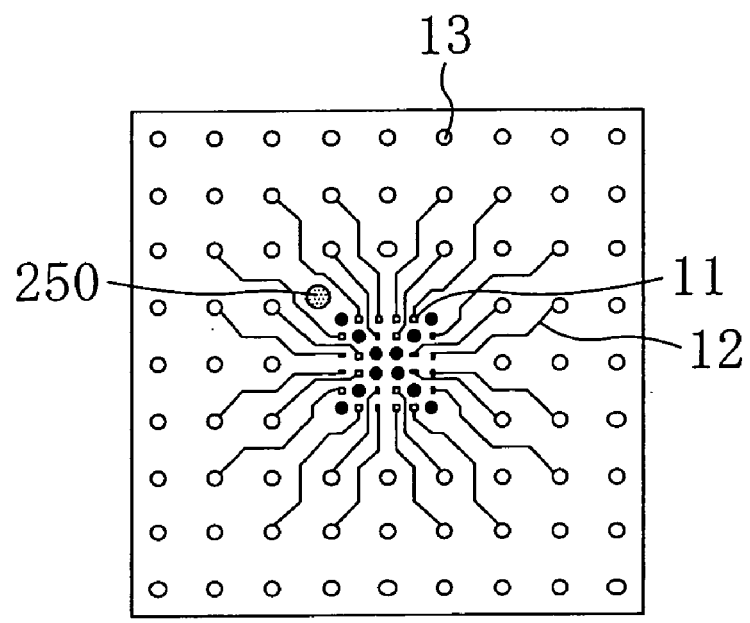
FIGS. 13A and 13B are plan views illustrating the upper face and the back face, respectively, of a first resin board for use in a semiconductor module according to a fifth embodiment of the present invention.
Figure 13B:
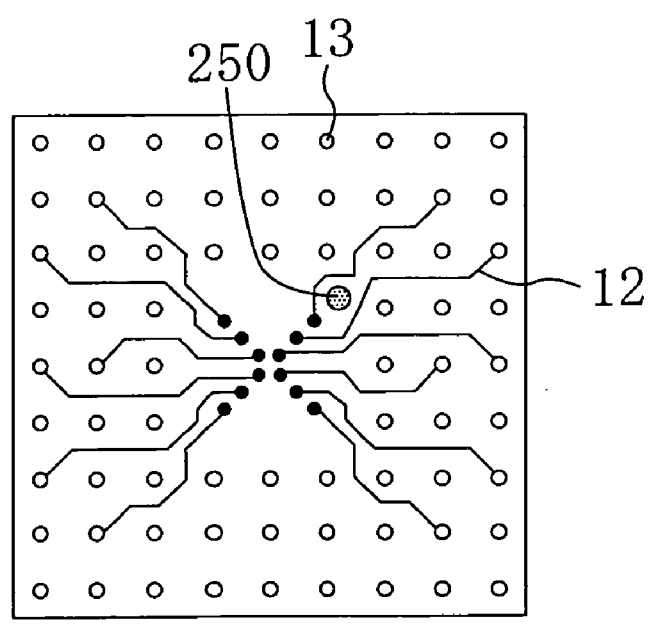

FIGS. 13A and 13B are views illustrating the upper face and the back face, respectively, of a first resin board 300 for use in the semiconductor module of this embodiment.

As illustrated in FIGS. 13A and 13B, the semiconductor module of this embodiment has a characteristic in which semiconductor-device connecting terminals 11 are collectively provided on a center region of a first resin board 300 and a second resin board (not shown) on which a semiconductor chip 200 is to be mounted.

According to this arrangement, wires 12 connecting the semiconductor-device connecting terminals 11 to connecting lands 13 are also different from those in the semiconductor module 1 of the first embodiment. Specifically, as illustrated in FIGS. 13A and 13B, in the semiconductor module of this embodiment, the wires 12 are formed on both the upper and back faces of the resin board, so that the wires 12 are arranged at a relatively wide pitch whereas the semiconductor-device connecting terminals 11 are arranged at a fine pitch.

Figure 14A:
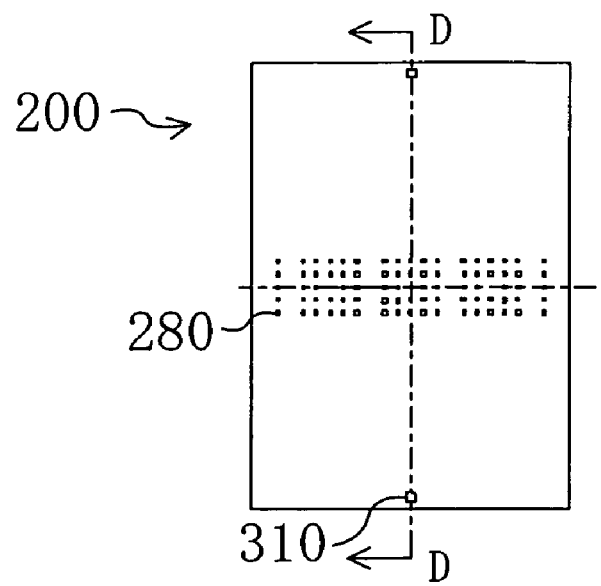
FIGS. 14A and 14B are a plan view illustrating a semiconductor chip to be mounted on a first resin board of the fifth embodiment and a cross-sectional view taken along the line D-D in FIG. 14A, respectively.
Figure 14B:
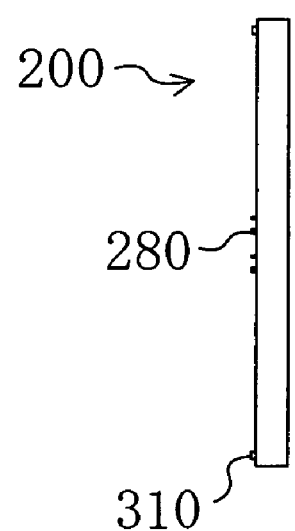

FIGS. 14A and 14B are a plan view illustrating a semiconductor chip 200 to be mounted on a first resin board of this embodiment and a cross-sectional view taken along the line D-D in FIG. 14A, respectively. As illustrated in FIGS. 14A and 14B, electrode bumps 280 are collectively formed on a center portion of the semiconductor chip 200 and projections 310 having an identical height are formed at both ends of the semiconductor chip 200 in the length direction.

Figure 15:
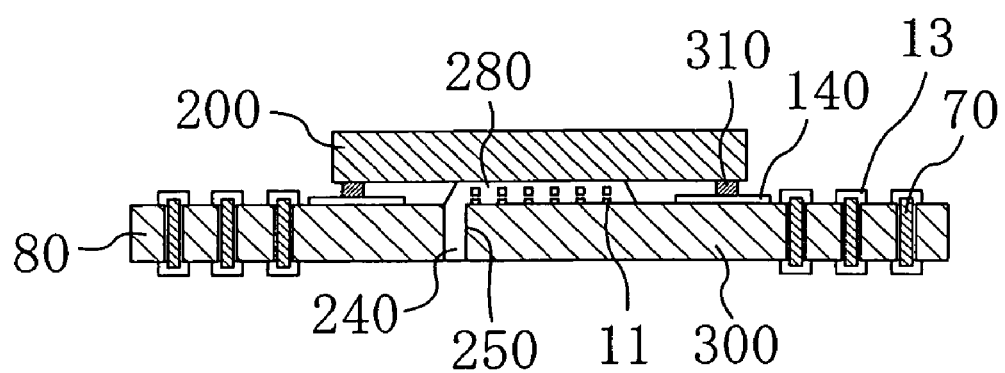
FIG. 15 is a cross-sectional view illustrating the semiconductor module of the fifth embodiment in a state in which a semiconductor chip is mounted on a first resin board.

FIG. 15 is a cross-sectional view illustrating a state in which the semiconductor chip 200 of this embodiment is mounted on the first resin board 300. As illustrated in FIG. 15, in mounting the semiconductor chip 200, the semiconductor chip 200 is placed on the first resin board 300, and the electrode bumps 280 and the semiconductor-device connecting terminals 11 are bonded using solder or a conductive adhesive. The projections 310 of the semiconductor chip 200 prevent the semiconductor chip 200 from being tilted during positioning for the bonding, thus allowing the bonding to be performed with the semiconductor chip 200 and the first resin board 300 favorably kept in parallel with each other. In addition, the projections 310 prevent a crack or the like from occurring even when a load is applied to the semiconductor chip 200.

After the mounting, a gap between the first resin board 300 and the semiconductor chip 200 is filled and sealed with a liquid resin 240 containing an inorganic filler. If through holes 250 are formed near the semiconductor-device connecting terminals 11 of the first resin board 300 beforehand, the liquid resin 240 is easily injected from the back face after the mounting. If dummy electrodes 140 are provided on the first resin board 300 at positions corresponding to the projections 310, the first resin board 300 and the semiconductor chip 200 are more favorably kept in parallel. The sealing with the liquid resin 240 is not necessarily performed and may be omitted. Alternatively, after the sealing with the liquid resin 240, a peripheral portion including the projections 310 may be sealed using a more flexible resin material. The use of a material having flexibility allows absorption of a stress caused by the difference in linear expansion coefficient.

The first resin board 300 includes the semiconductor-device connecting terminals 11, the connecting lands 13, the wires 12, the dummy electrodes 140 and the first buried conductors on a first resin member 80. Such resin boards 300, including a second resin board (not shown) formed in the same manner as the first resin boards 300, and sheet members having a shape according to the arrangement of the resin boards are alternately stacked and united by application of heat and pressure, thereby forming a semiconductor module (not shown) of this embodiment.

In the multi-level semiconductor module of this embodiment thus formed, the area where the semiconductor chip 200 is bonded to the first resin board 300 or the second board (not shown) is small and portions for this bonding are collectively arranged, so that a warp of the bimetal structure caused by the difference in linear expansion coefficient between the semiconductor chip 200 and the first resin board 300 (or the second resin board) is effectively suppressed.

Embodiment 6

A multi-level semiconductor module according to a sixth embodiment of the present invention will be described with reference to FIG. 16.

Figure 16:
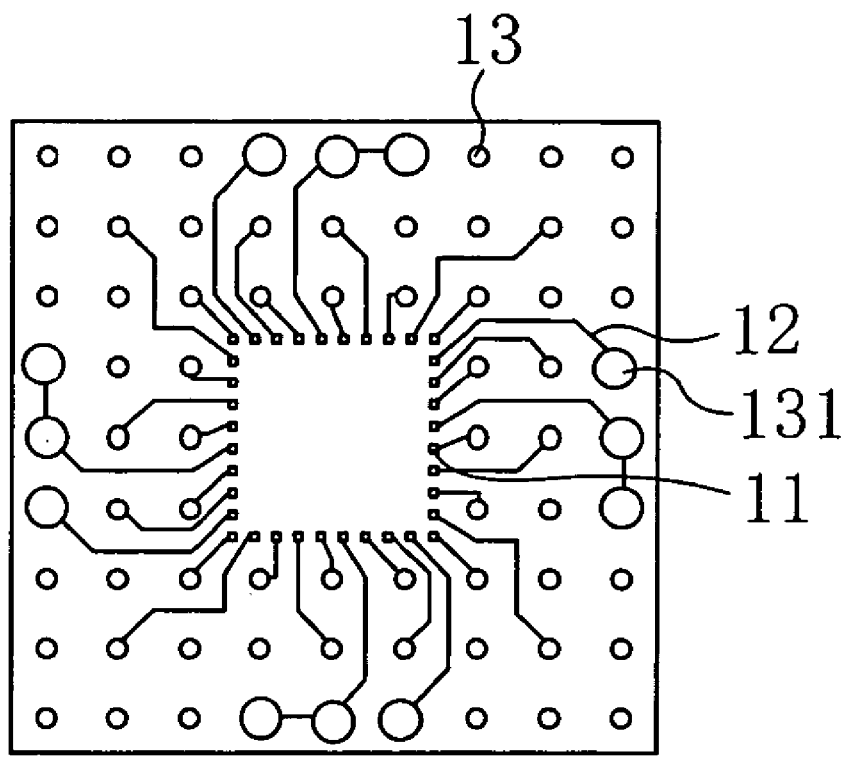
FIG. 16 is a plan view illustrating a first resin board for use in a semiconductor module according to a sixth embodiment of the present invention.

FIG. 16 is a plan view illustrating a first resin board 400 for use in the multi-level semiconductor module of this embodiment. As illustrated in FIG. 16, the multi-level semiconductor module of this embodiment has a characteristic in which the diameters of connecting lands 131 and first buried conductors for connection to electrode bumps previously provided on a semiconductor chip 2 are larger than those of the other connecting lands 13 and first buried conductors.

The previously-formed electrode bumps are input/output terminals requiring high-speed operation (e.g., transmission of digital signals at 100 MHz or higher) of, for example, the semiconductor chip 2, power sources, ground terminals and analog terminals, for example. The resistances and impedances of these terminals need to be reduced so as to form stable lines. On the other hand, the electrode bumps and wires connected to the bumps need to be densely arranged, so that it is necessary to reduce the diameters of wires and vias for the other terminals as much as possible according to signal characteristics. In this embodiment, the diameter of first buried conductors (not shown) forming transmission lines connected to input/output terminals requiring high-speed operation of the semiconductor chip 2, power sources, ground terminals and analog terminals, for example, and the diameter of connecting lands 131 formed around the first buried conductors are increased.

Though not shown, the diameter of associated second buried conductors in sheet members is increased. The first resin boards 400 having the foregoing structure, a second resin member and the sheet members are stacked and subjected to application of pressure and heat in the same manner as in the fabrication method of the first embodiment, thereby obtaining a multi-level semiconductor module (not shown) of this embodiment.

In the semiconductor module of this embodiment, in the case of requiring transmission lines for transmitting/receiving high-speed signals or analog signals out of signals processed through input/output terminals on semiconductor chips 2, electric signals are transmitted/received with stability because the diameters of first and second buried conductors forming part of the transmission lines are increased. In particular, in a stacked structure, problems such as the difference in diameter between conductors and holes for burying the conductors, formation of insufficient junction at buried conductor portions, and variation of connection resistance because of, for example, a warp might arise in each of stacked resin boards and sheet members. Accordingly, impedance can vary among the levels and signals can be reflected because of mismatching among the levels, resulting in the possibility of variation in characteristics. However, in the semiconductor module of this embodiment, such problems are prevented. In addition, resistance components on transmission lines are reduced, thus suppressing heat generation inside the module caused by Joule heat.

Other Embodiment

In the first through sixth embodiments, a glass-epoxy resin, for example, is mainly used for the first resin boards. However, the resin boards of the present invention are not limited to this. For example, a mixture containing 70 wt % to 95 wt %, both inclusive, of an inorganic filler and a thermosetting resin may be used for the first resin bases forming the first and second resin boards or the second resin bases forming the sheet members 5. The resin cores forming the sheet members 5 and the first and second resin boards 3 and 4 may be made of the same material. The use of such materials allows linear expansion coefficients to approach that of semiconductor chips, and thus the present invention is effective in suppressing a warp.

As described above, in a multi-level semiconductor module according to the present invention, the occurrence of a warp is suppressed and the module is coupled to a mother board with high yield. Accordingly, the multi-level semiconductor module is useful for size reduction and functional enhancement of various electronic devices such as cellular phones and digital cameras.

What is claimed is:

1. A multi-level semiconductor module formed by alternately stacking resin boards and sheet members, each of the resin boards including one or more first buried conductors and having an upper face on which a semiconductor chip is mounted, each of the sheet members having an opening for accommodation of the semiconductor chip and including one or more second buried conductors electrically connected to the first buried conductors, wherein one of the resin boards located at the bottom has a thickness larger than that of each of the other resin board or boards, the semiconductor chip provided with a semiconductor memory is mounted on each of the resin board or boards except for the resin board located at the bottom, and the semiconductor chip mounted on the resin board at the bottom is provided with a controlling semiconductor device for controlling the semiconductor memory.

2. The multi-level semiconductor module of claim 1, wherein each of the sheet members includes a resin base and the second buried conductors provided around the opening, and the resin base has a thickness larger than that of the semiconductor chip.

3. The multi-level semiconductor module of claim 1, wherein the first buried conductors are formed through each of the resin boards, and the second buried conductors connected to the first buried conductors project from upper and back faces of the resin base.

4. The multi-level semiconductor module of claim 1, wherein a plurality of external connection terminals for connection to external equipment are formed on a back face of the resin board located at the bottom.

5. The multi-level semiconductor module of claim 1, wherein out of the resin boards, at least one of the resin board located at the bottom and the resin board located at the top has a thickness larger than that of each of the semiconductor chip or chips mounted on the other resin board or boards.

6. The multi-level semiconductor module of claim 1, further includes a rigid plate having a thermal conductivity higher than that of the resin boards, the rigid plate being located over one of the resin boards located at the top.

7. A multi-level semiconductor module formed by alternately stacking resin boards and sheet members, each of the resin boards including one or more first buried conductors and having an upper face on which a semiconductor chip is mounted, each of the sheet members having an opening for accommodation of the semiconductor chip and including one or more second buried conductors electrically connected to the first buried conductors, wherein one of the resin boards located at the bottom has a thickness larger than that of each of the ether resin board or boards, and each of the first buried conductors in the resin board or boards except for the resin boards located at the bottom and the top has a diameter larger than that of each of the first buried conductors in the resin boards located at the bottom and the top.

8. The multi-level semiconductor module of claim 7, wherein each of the second buried conductors in the sheet member or members except for the sheet members in contact with the resin boards located at the bottom and the top has a diameter larger than that of each of the second buried conductors in the sheet members in contact with the resin boards located at the bottom and the top.

9. The multi-level semiconductor module of claim 1, wherein one or more electrode bumps are provided on a principal surface of the semiconductor chip, and each of the resin boards further includes: one or more connection terminals bonded to the electrode bumps;

and one or more wires connecting the connection terminals to the first buried conductors.

10. The multi-level semiconductor module of claim 9, wherein the electrode bumps are provided on a center region of the semiconductor chip, and the wires are provided on each of an upper face and a back face of each of the resin boards.

11. A multi-level semiconductor module formed by alternately stacking resin boards and sheet members, each of the resin boards including one or more first buried conductors and having an upper face on which a semiconductor chip is mounted, each of the sheet members having an opening for accommodation of the semiconductor chip and including one or more second buried conductors electrically connected to the first buried conductors, wherein one of the resin boards located at the bottom has a thickness larger than that of each of the other resin board or boards, one or more electrode bumps are provided on a principal surface of the semiconductor chip, each of the resin boards further includes: one or more connection terminals bonded to the electrode bumps; and one or more wires connecting the connection terminals to the first buried conductors, the electrode bumps are provided on a center region of the semiconductor chip, the wires are provided on each of an upper face and a back face of each of the resin boards, the semiconductor chip further includes projections having an identical height and located at both ends of the principal surface, and each of the resin boards further includes one or more dummy electrodes in contact with the projections.

12. A multi-level semiconductor module formed by alternately stacking resin boards and sheet members, each of the resin boards including one or more first buried conductors and having an upper face on which a semiconductor chip is mounted, each of the sheet members having an opening for accommodation of the semiconductor chip and including one or more second buried conductors electrically connected to the first buried conductors, wherein one of the resin boards located at the bottom has a thickness larger than that of each of the other resin board or boards, one or more electrode bumps are provided on a principal surface of the semiconductor chip, each of the resin boards further includes: one or more connection terminals bonded to the electrode bumps; and one or more wires connecting the connection terminals to the first buried conductors, and each of one or more of the first buried conductors connected to the electrode bumps has a diameter larger than that of each of the other first buried conductor or conductors.

13. A multi-level semiconductor module formed by alternately stacking resin boards and sheet members, each of the resin boards including one or more first buried conductors and having an upper face on which a semiconductor chip is mounted, each of the sheet members having an opening for accommodation of the semiconductor chip and including one or more second buried conductors electrically connected to the first buried conductors, wherein one of the resin boards located at the bottom has a thickness larger than that of each of the other resin board or boards, and the resin base forming each of the resin boards is made of a mixture containing 70 wt % to 95 wt %, both inclusive, of an inorganic filler and a thermosetting resin.

* * * * *